United States Patent
Shimizu et al.

(10) Patent No.: US 7,880,174 B2
(45) Date of Patent: Feb. 1, 2011

(54) CIRCUIT ARRANGEMENT HAVING A FREE-WHEEL DIODE

(75) Inventors: Haruka Shimizu, Kokubunji (JP); Katsumi Ishikawa, Hitachinaka (JP); Masahiro Nagasu, Hitachinaka (JP); Dai Tsugawa, Mito (JP)

(73) Assignee: Hitachi, Ltd., Tokyo (JP)

( * ) Notice: Subject to any disclaimer, the term of this patent is extended or adjusted under 35 U.S.C. 154(b) by 436 days.

(21) Appl. No.: 12/030,156

(22) Filed: Feb. 12, 2008

(65) Prior Publication Data
US 2008/0258252 A1 Oct. 23, 2008

(30) Foreign Application Priority Data
Apr. 20, 2007 (JP) .............................. 2007-111605

(51) Int. Cl.
*H01L 27/00* (2006.01)
(52) U.S. Cl. .................. 257/77; 257/449; 257/458; 257/471; 257/478; 257/476
(58) Field of Classification Search .................. 257/76, 257/77, 279–458, 471–479, E27.12
See application file for complete search history.

(56) References Cited

U.S. PATENT DOCUMENTS

| 7,199,442 | B2 * | 4/2007 | Shenoy | ........................ 257/476 |
| 7,202,528 | B2 * | 4/2007 | Sankin et al. | ................ 257/281 |
| 2009/0134405 | A1 * | 5/2009 | Ota et al. | ........................ 257/77 |
| 2009/0283776 | A1 * | 11/2009 | Iwamuro | ...................... 257/76 |

FOREIGN PATENT DOCUMENTS

| JP | 2590284 B2 | 12/1996 |
| JP | 2006-149195 A | 6/2006 |

OTHER PUBLICATIONS

R. Rupp et al., "'2nd Generation' SiC Schottky diodes: A new benchmark in SiC device ruggedness," Proceedings of the 18th International Symposium on Power Semiconductor Devices & IC's, Jun. 4-8, 2006.

* cited by examiner

*Primary Examiner*—Cuong Q Nguyen
(74) *Attorney, Agent, or Firm*—Miles & Stockbridge P.C.

(57) ABSTRACT

An object of the present invention is to reduce the conducting loss of an existing conversion circuit while suppressing its noise. The present invention is typically a circuit arrangement includes at least one switching device and a free-wheel diode connected in parallel with the switching device. The free-wheel diode is formed by connecting a silicon PiN diode in parallel with a Schottky barrier diode that uses a semiconductor material having a wider band gap than silicon as a base material. The silicon PiN diode and Schottky barrier diode are separate chips.

8 Claims, 9 Drawing Sheets

CIRCUIT ARRANGEMENT HAVING A FREE-WHEEL DIODE

CLAIM OF PRIORITY

The present application claims priority from Japanese application JP 2007-111605 filed on Apr. 20, 2007, the content of which is hereby incorporated by reference into this application.

BACKGROUND OF THE INVENTION

1. Field of the Invention

The present invention relates to a circuit arrangement having at least one switching device and a free-wheel diode connected in parallel with the switching device. The present invention is particularly useful when it is applied to a power semiconductor module having a rectifying device.

2. Description of the Related Art

Semiconductor power modules are used in various fields as a device that composes an inverter. Particularly, power modules that use a Si-IGBT (Insulated Gate Bipolar Transistor) as a switching device and a Si-PiN diode (hereinafter referred to as a Si-PND) as a free-wheel diode exhibit low loss and high blocking voltage and are used in a wide variety of fields such as railroads and consumer electronics. In recent years, energy savings have become increasingly important. Therefore, it is demanded that the power modules exhibit lower loss. The loss of a power module is determined by the performance of an employed power device. The Si-IGBT has improved its performance year after year, whereas the Si-PND has not made a major breakthrough. Current diodes suffer a recovery current problem in which carriers stored in the diodes are discharged upon IGBT turn-on. This problem not only brings about an increased switching loss but also causes noise generation. Therefore, diodes with a minimum of recovery current are highly demanded. However, a region where the characteristics of the Si-PND are substantially determined by the material properties of Si is already reached. It is therefore difficult to greatly reduce the recovery current. One of some previously developed technologies for recovery current suppression provides the anode surface of a PiN diode (PND) with a region having a Schottky interface to restrict minority-carrier injection. An example of a PND having a Schottky region is disclosed in Japanese Patent No. 2590284.

On the other hand, power devices based on silicon carbide (SiC) are expected to exhibit higher performance than Si-based power devices due to excellent physical properties of SiC. Since SiC has high breakdown field strength, the thickness of a SiC-based device can be considerably smaller than that of a Si-based device. Therefore, even a unipolar SiC device can simultaneously exhibit high blocking voltage and low resistance upon power-on. Further, even if a bipolar SiC device is used, the thickness of the device can be small so that switching characteristics improve due to a decrease in the number of carriers stored in the device. Among SiC devices, diodes are more advanced in terms of low specific on-resistance and large capacity than switching devices. Therefore, an attempt is being made to achieve low loss by combining a Si-IGBT with a SiC diode. A combination of a Si-IGBT and SiC diode is described in JP-A-2006-149195.

A SiC diode differs from a Si diode in that the former permits a Schottky barrier diode (hereinafter referred to as the SBD) to exhibit a blocking voltage higher than 3 kV. Therefore, the SBD and PND can be selectively used depending on the blocking voltage class. The SBD is used in a low blocking voltage region because it has a lower built-in potential than the PND and reduces the forward voltage upon rated current application. Further, since it is a unipolar device, it can remarkably reduce the recovery current prevailing upon IGBT turn-on. However, as the recovery current is reduced to substantially zero, the electrical current sharply changes. This causes the capacitance and inductance components in a circuit to resonate, thereby generating switching noise. The noise may not only damage the device but also make the entire system faulty. Furthermore, the SBD cannot permit a large current to flow in marked contrast to the PND. Therefore, the SBD might be damaged by a momentary large current called a surge. On the other hand, the PND has a high built-in potential so that the forward voltage prevailing upon rated current application is high in a low blocking voltage region. However, since the PND is a bipolar device, the voltage increase due to the thickness of a drift layer is limited. In a high blocking voltage region, therefore, the PND is lower than the SBD in the forward voltage prevailing upon rated current application. In addition, the PND has high resistance to a surge because it permits a large current to flow. As the SBD and PND have their own advantages and disadvantages as described above, they should be selectively used to achieve the intended purpose.

Meanwhile, a structure called an MPS (Merged PiN Schottky) was recently proposed as a device that is obtained by combining the above two diodes. This structure has both a PN junction region and a Schottky junction region on the anode side. In a normal operating region, the Schottky junction region mainly works. When a surge current flows, the PN junction region operates for device protection. Further, this structure can suppress a leak current from a Schottky junction because, when a reverse bias is applied, a depletion layer extends from the PN junction region to prevent the Schottky junction region from being exposed to a high electric field. An example of the MPS is disclosed in "2nd Generation SiC Schottky Diode: A New Benchmark in SiC Device Ruggedness" (Proceedings of ISPSD 2006, 305).

SUMMARY OF THE INVENTION

Figure 9:
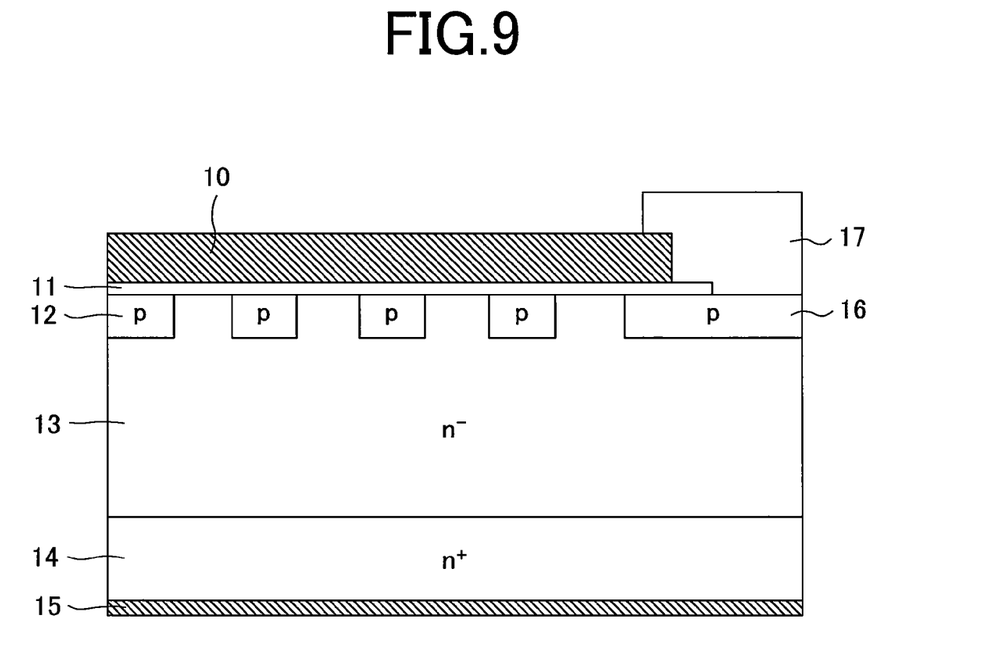
FIG. 9 is a cross-sectional view illustrating a typical conventional MPS structure.

In an MPS device or other similar device in which only the SBD operates in a normal state, however, the aforementioned capacitance and inductance components in a circuit resonate to generate noise. Noise can be suppressed when a small amount of recovery current flows to provide soft switching. In the above-mentioned MPS structure, however, noise cannot be suppressed because the PND does not operate in a normal operation region and substantially no recovery current flows. The MPS structure is shown in FIG. 9. It has both the PN junction region and Schottky junction region on the anode side. It has a multilayer that includes a highly-concentrated N$^+$ type layer 14 and an N$^-$ type drift layer 13. Within the N$^-$ type drift layer 13, a plurality of p type impurity layers 12 and a p type termination layer 16 are formed. For the p type impurity layers 12, an anode electrode 10 is formed with a contact metal layer 11 positioned between them. The interface between the reference numerals 11 and 13 is a Schottky junction section, whereas the interface between the reference numerals 12 and 13 is a PN junction section. A cathode electrode 15 is formed on the rear surface of the highly-concentrated N$^+$ type layer 14. The reference numeral 17 denotes an insulation layer.

In applications where a blocking voltage of 3 kV or higher is required, the forward voltages of the PND and SBD may be substantially equal in a normal operating region even when the MPS structure is employed. Therefore, the two different diodes may simultaneously operate to suppress noise. However, if the MPS structure is directly used in applications where a blocking voltage is required, the potential gradient concentrates in a Schottky region so that substantially no potential gradient arises near a PN junction region. As a result, the PND fails to operate even when the applied voltage is higher than the built-in potential of a PN junction.

The present invention has been made in view of the above technical circumstances. An object of the present invention is to reduce conducting loss of an existing conversion circuit while suppressing noise in the circuit.

The present invention is characterized chiefly by the fact that a free-wheel diode in a power module includes an SBD and PND, which are separate chips positioned in parallel with each other. The SBD uses a semiconductor material having a wider band gap than silicon as a base material. The PND uses silicon or a semiconductor material having a wider band gap than silicon as a base material. Major aspects of the present invention are enumerated below:

(1) According to one aspect of the present invention, there is provided a circuit arrangement including at least one switching device and a free-wheel diode connected in parallel with the switching device. The free-wheel diode is formed by connecting a silicon PiN diode in parallel with a Schottky barrier diode that uses a semiconductor material having a wider band gap than silicon as a base material. The silicon PiN diode and Schottky barrier diode are separate chips.

(2) According to another aspect of the present invention, there is provided a circuit arrangement including at least one switching device and a free-wheel diode connected in parallel with the switching device. The free-wheel diode is formed by connecting a PiN diode in series with two or more Schottky barrier diodes. The Schottky barrier diodes use a semiconductor material having a wider band gap than silicon as a base material. The PiN diode uses a semiconductor material having a wider band gap than silicon as a base material. The Schottky barrier diodes and PiN diode are separate chips.

(3) According to another aspect of the present invention, there is provided the circuit arrangement as described in (1) above, wherein the semiconductor material having a wider band gap than silicon is silicon carbide (SiC) or gallium nitride (GaN).

(4) According to another aspect of the present invention, there is provided the circuit arrangement as described in (2) above, wherein the semiconductor material that constitutes the Schottky barrier diodes and the PiN diode and that has a wider band gap than silicon is silicon carbide (SiC) or gallium nitride (GaN).

(5) According to another aspect of the present invention, there is provided the circuit arrangement as described in (1) above, wherein the Schottky barrier diode includes a plurality of parallel-connected Schottky barrier diode chips; and wherein the PiN diode includes a smaller number of chips than the Schottky barrier diode.

(6) According to another aspect of the present invention, there is provided the circuit arrangement as described in (1) above, wherein the PiN diode has a smaller junction area than the Schottky barrier diode.

(7) According to another aspect of the present invention, there is provided the circuit arrangement as described in (1) above, wherein the Schottky barrier diode is a junction barrier Schottky diode.

(8) According to still another aspect of the present invention, there is provided the circuit arrangement as described in (2) above, wherein the Schottky barrier diodes are junction barrier Schottky diodes.

The present invention has been outlined above. According to the present invention, the SBD and PND are basically connected in parallel with each other as separate chips. Therefore, the SBD and PND independently operate with a voltage equally applied to them. Further, since the present invention is used near a current region where the forward voltages of the SBD and PND are equal, noise can be suppressed without sacrificing the excellent recovery characteristics of the SBD.

The present invention makes it possible to suppress noise in an existing conversion circuit.

DETAILED DESCRIPTION OF THE PREFERRED EMBODIMENTS

Embodiments of the present invention will now be described with reference to the accompanying drawings.

A first embodiment of the present invention will now be described. The first embodiment is an example of a circuit arrangement including at least one switching device and a free-wheel diode connected in parallel with the switching device, wherein the free-wheel diode is formed by connecting a silicon PiN diode in parallel with a Schottky barrier diode that uses a semiconductor material having a wider band gap than silicon as a base material; and wherein the silicon PiN diode and Schottky barrier diode are separate chips. A typical example of the semiconductor material having a wider band gap than the silicon is silicon carbide (SiC). Gallium nitride (GaN) can also be used as the above semiconductor material. The free-wheel diode smoothes a sudden circuit change due to the switching of a switching device and retains a characteristic voltage to protect the switching device, which supplies a necessary current to a load while it is off.

Figure 1:
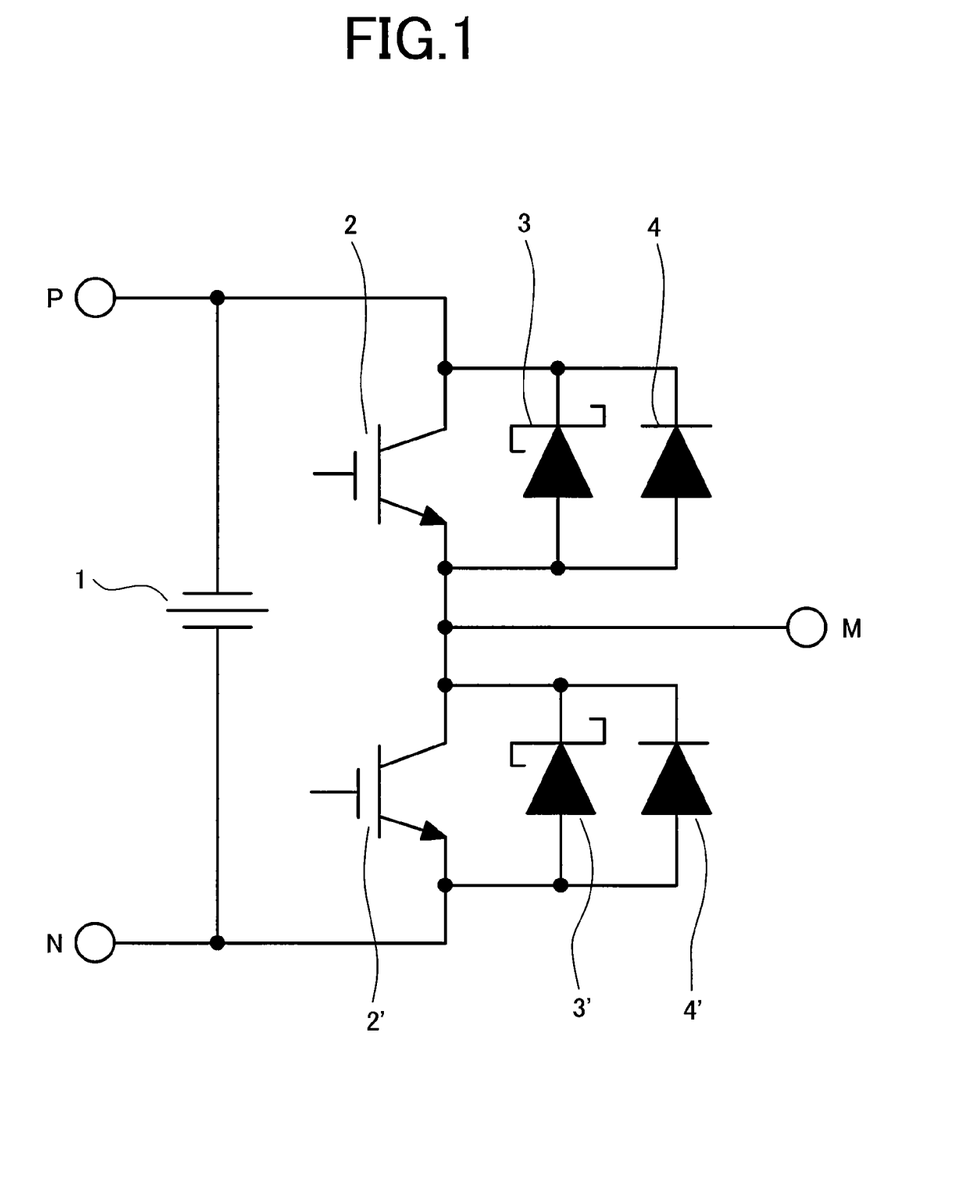
FIG. 1 is a circuit diagram illustrating a module according to a first embodiment of the present invention.
Figure 2:
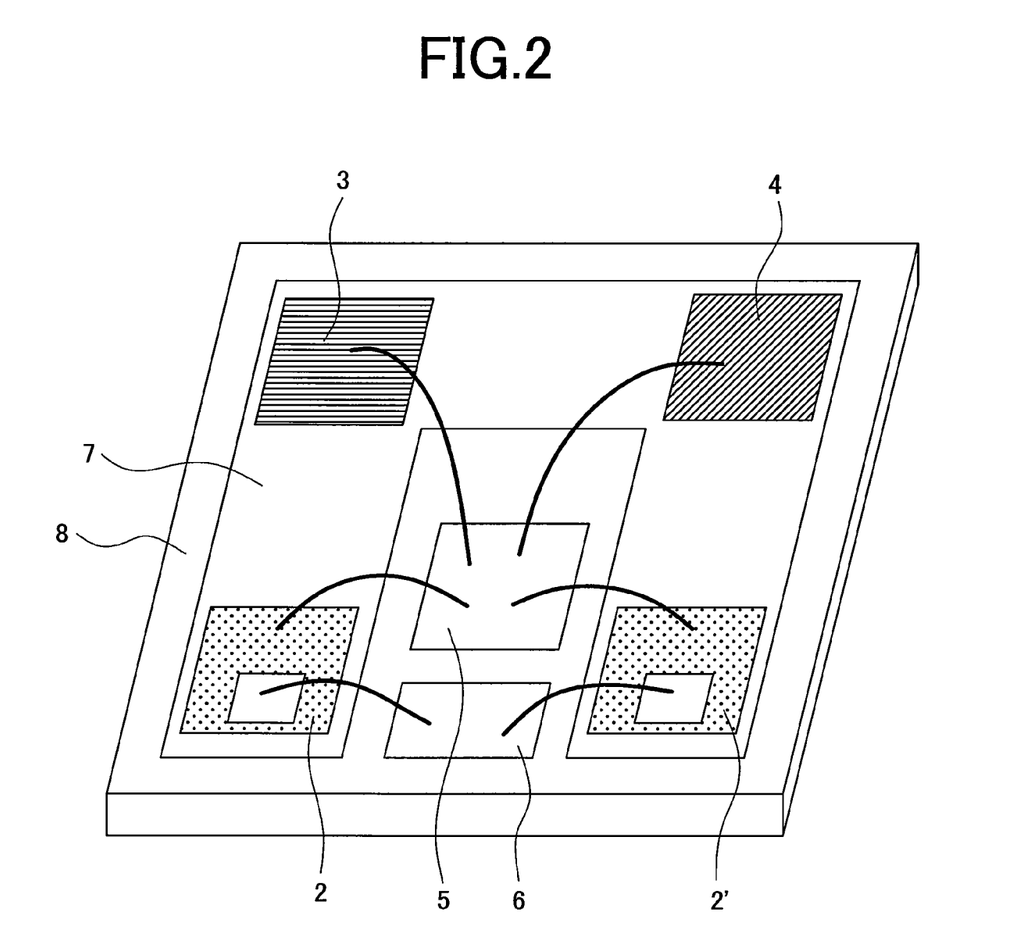
FIG. 2 is a perspective view illustrating the module according to the first embodiment of the present invention.

FIG. 1 illustrates the first embodiment and shows a main part of a circuit diagram depicting a power module that is used as an inverter circuit. FIG. 2 is a perspective view illustrating a part of the power module. Switching devices Si-IGBT 2 and Si-IGBT 2' in FIG. 2 correspond to an IGBT 2 in FIG. 1. In the power module, an SiC-SBD 3 and Si-PND 4 are connected in parallel with the Si-IGBT 2. Both ends of the Si-IGBT 2 are connected to a power supply of the inverter circuit. Elements of the inverter circuit are mounted on a circuit board 8 and arranged as shown in FIG. 2. FIG. 2 shows only a part of a circuit and does not depict the entire circuit. Reference numerals in FIG. 2 correlate to those in FIG. 1. The reference numeral 5 denotes an emitter terminal. The reference numeral 6 denotes a gate terminal. The reference numeral 7 denotes a collector terminal.

The operation of the present embodiment will now be briefly described. In a three-phase inverter circuit, two series-connected IGBTs (IGBT 3 and IGBT 3') are three-phase parallel connected; therefore, a total of six IGBTs can be sequentially turned on/off to convert direct current to arbitrary alternating current. The diodes (Schottky barrier diodes 3, 3' and PiN diodes 4, 4') connected in parallel with the IGBTs provide necessary current while the IGBTs are off. When, for instance, IGBT 3 turns off, the current flowing to a load flows to Schottky barrier diode 3' and PiN diode 4', which are connected in parallel with IGBT 3'. In this instance, the ratio between the current flows to the diodes is determined by the area ratio between the diodes and their static characteristics. If IGBT 3' turns on in the above state, the current supplies to Schottky barrier diode 3' and PiN diode 4' shut off so that carriers stored in the diodes flow in an opposite direction as a recovery current. Although the recovery current may cause an increase in the switching loss, it functions as a damper that suppresses noise generated upon circuit resonance.

Figure 3:
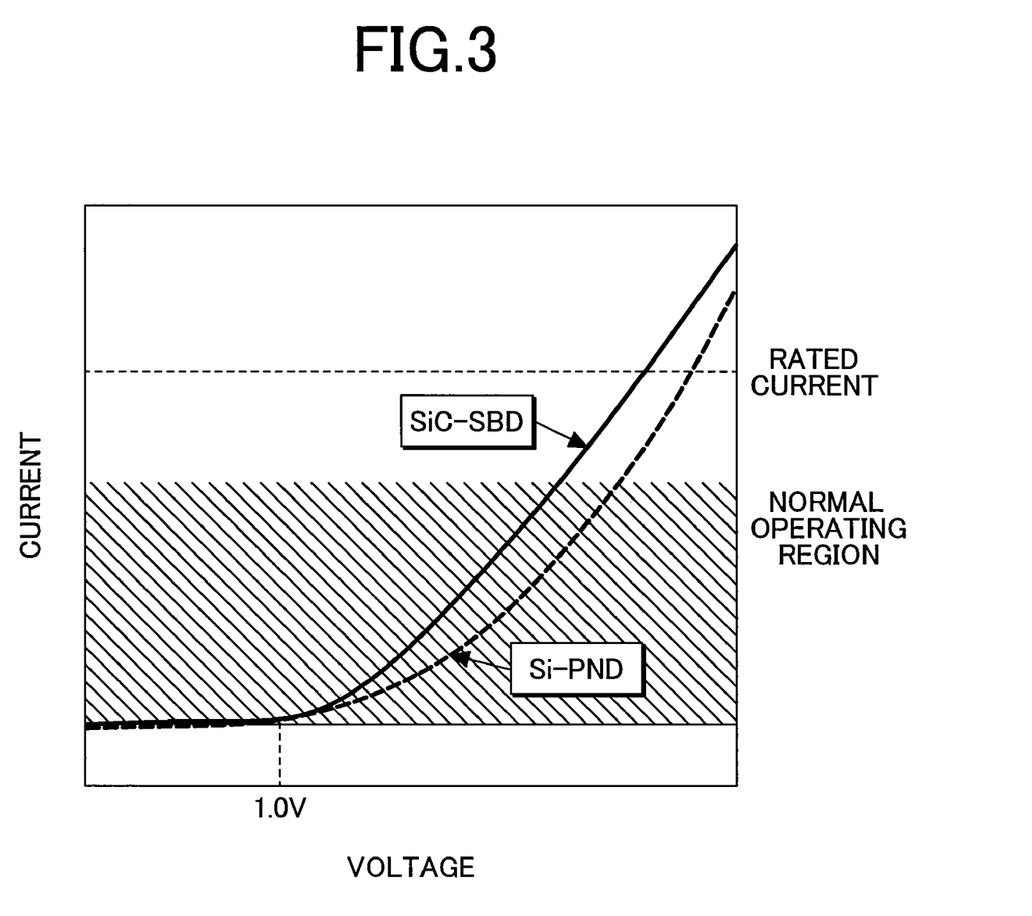
FIG. 3 shows the current-voltage characteristics of the module according to the first embodiment of the present invention.
Figure 4:
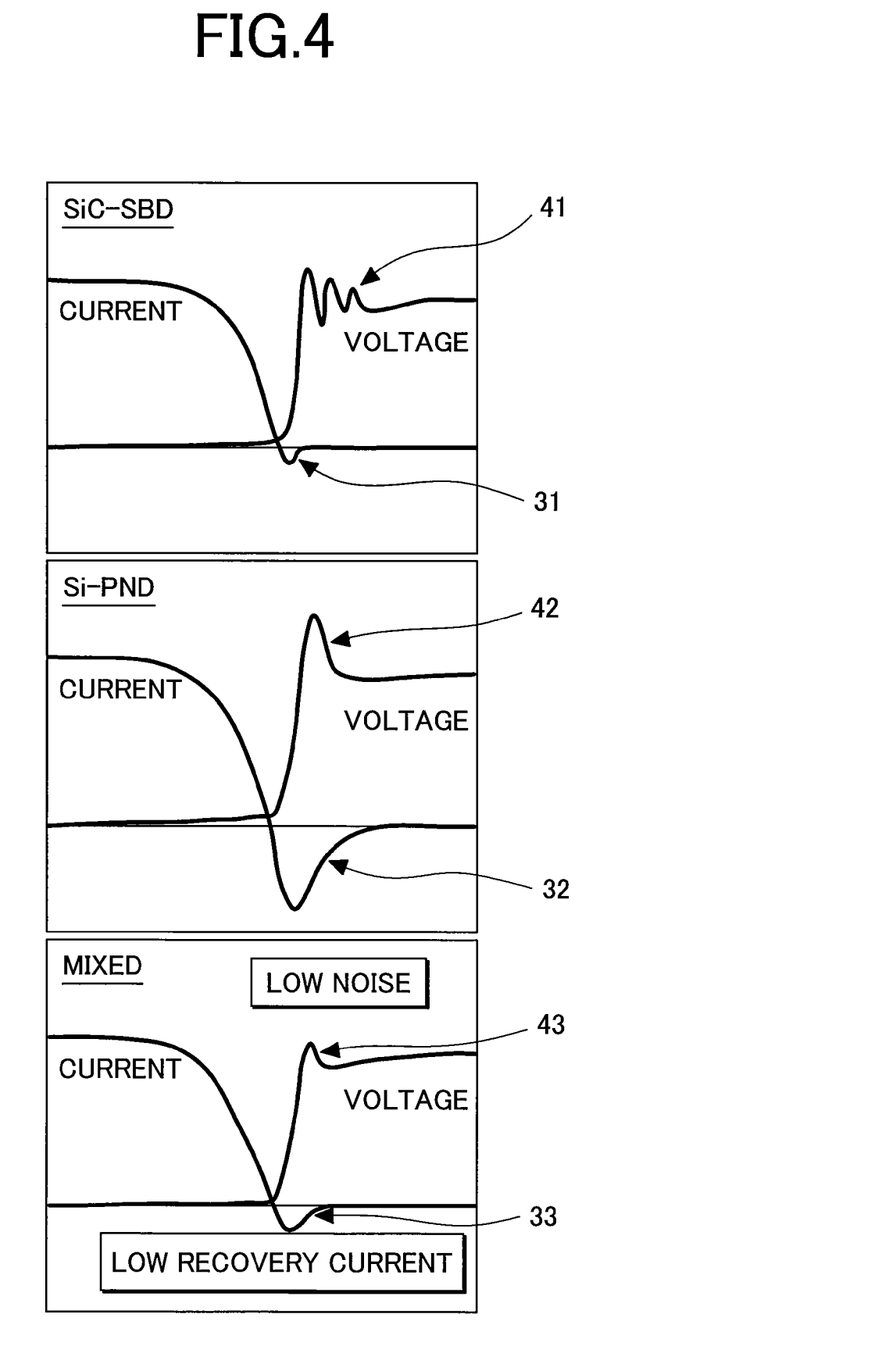
FIG. 4 illustrates the advantages provided by the module according to the first embodiment of the present invention.

Advantages provided by the combination of the SiC-SBD and Si-PND will now be described. The Si-PND involves a larger amount of recovery current than the SiC-SBD. Therefore, when the SiC-SBD is mixed with a Si-PND having a small area, noise can be suppressed. FIG. 3 shows the comparison between the static characteristics of the SiC-SBD and Si-PND. This figure shows an example of a rated current and an example of a normal operation region (shaded). The use of the Si-PND is characterized by the fact that the ratio between the current flows to the SiC-SBD and Si-PND can be rendered substantially constant in any current region because the SiC-SBD is similar to the Si-PND in static characteristics as shown in FIG. 4. Therefore, the ratio between the current flows to the SiC-SBD and Si-PND can be constantly optimized. This makes it possible to effectively improve the tradeoff between noise and recovery. Further, the present embodiment is effective irrespective of blocking voltage because the static characteristics of the SiC-SBD and Si-PND are relatively similar to each other in any blocking voltage class. The present embodiment assumes that each device exhibits a blocking voltage of 4.5 kV.

Typical characteristics will now be described. For comparison purposes, FIG. 4 shows the recovery characteristics prevailing when the inverter circuit includes a SiC-SBD only, includes a Si-PND only, or includes both the SiC-SBD and Si-PND. FIG. 4 is divided into three drawings to depict the above three different situations and respectively marked "SiC-SBD," "Si-PND," and "Mixed." In each drawing, the horizontal axis indicates time, whereas the vertical axis indicates current or voltage. When the inverter circuit includes a SiC-SBD only, the capacitance and inductance components in a circuit resonate to generate noise (41) although the recovery current 31 is extremely small. When the inverter circuit includes a Si-PND only, noise generation does not occur (42) because switching is soft although the recovery current 32 is large. When the inverter circuit includes both the SiC-SBD and Si-PND, noise generation does not occur (43) because the PND operates although the recovery current 33 is intermediate between those of the SBD and PND.

Figure 5:
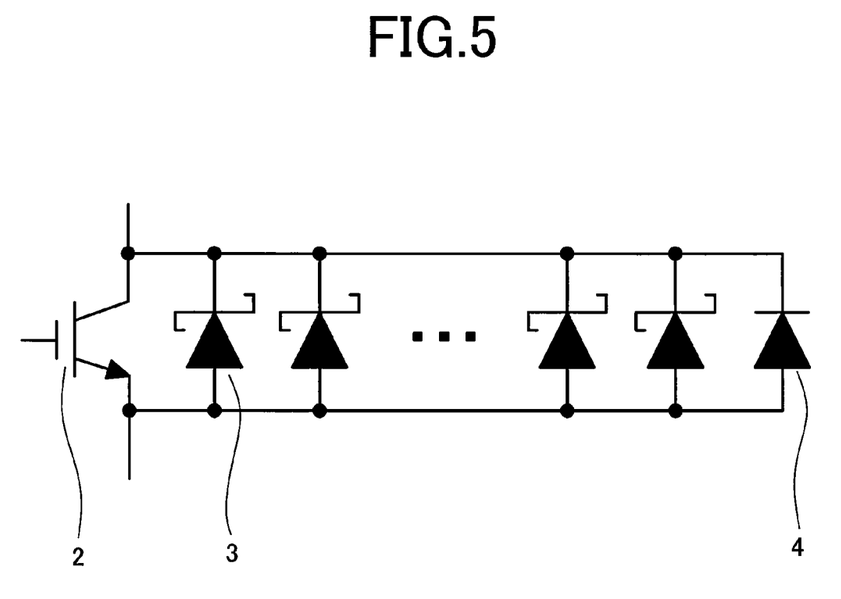
FIG. 5 is a part of a circuit diagram illustrating the module according to another embodiment of the present invention.
Figure 6:
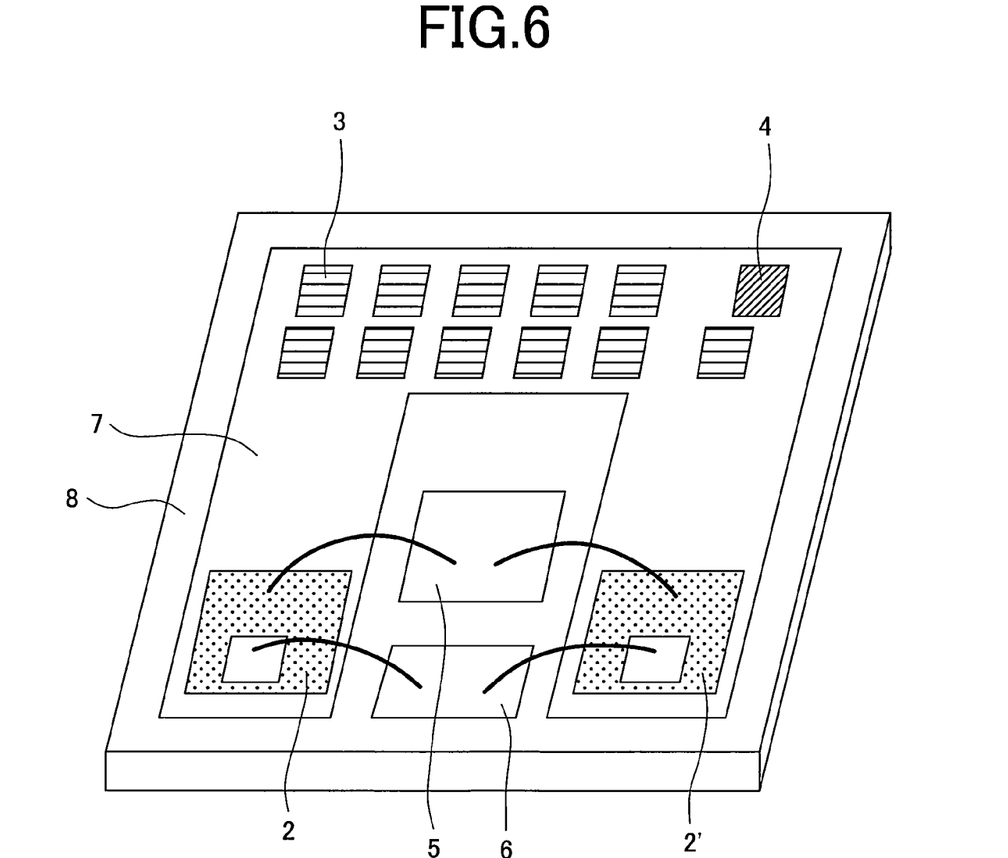
FIG. 6 is perspective view illustrating the module according to another embodiment of the present invention.

It is preferred that the SBD have a larger area than the PND. The reason is that the greater part of current should flow to the SBD from the viewpoint of loss because the recovery current of the SBD is smaller than that of the PND. The PND should have a minimal area required for noise reduction. The ratio of PND to SBD that is required for noise reduction varies, for instance, with circuit inductance. However, noise reduction can be achieved when the current flow to the PND is less than half the current flow to the SBD. The area ratio should not be changed by changing the area of each chip. For better results, it should be changed by changing the number of chips as indicated in FIGS. 5 and 6. This makes it easy to change the area ratio.

The first embodiment uses a combination of a SiC-SBD and Si-PND. However, the SBD may be replaced with a junction barrier Schottky diode (JBS). The JBS is a device that has a P region on the surface of an SBD and protects the Schottky interface as a depletion layer extends from a PN junction region when a reverse bias is applied. The JBS differs from the MPS in that the PN junction region does not function as a diode because the ohmic contact with the P region is not formed. Therefore, the forward characteristics of the JBS are the same as those of the SBD and can be applied to the present embodiment.

A second embodiment of the present invention will now be described. The second embodiment is an example of a circuit arrangement including at least one switching device and a free-wheel diode connected in parallel with the switching device, wherein the free-wheel diode is formed by connecting two or more series-connected PiN diodes in parallel with a Schottky barrier diode that uses a semiconductor material having a wider band gap than silicon as a base material; wherein the PiN diodes use a semiconductor material having a wider band gap than silicon as a base material; and wherein the Schottky barrier diode and the PiN diodes are separate chips.

Figure 7:
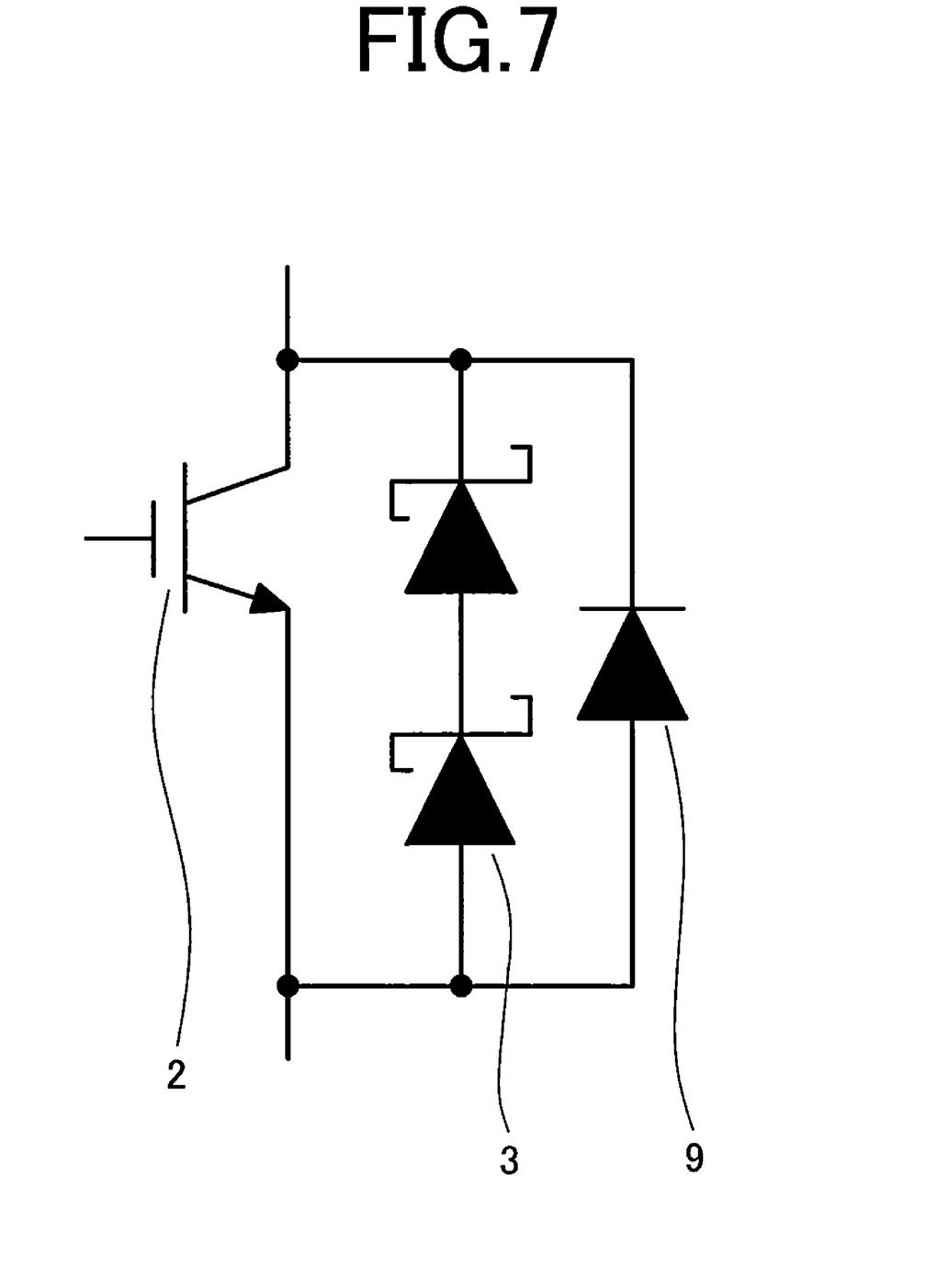
FIG. 7 is a part of a circuit diagram illustrating the module according to a second embodiment of the present invention.
Figure 8:
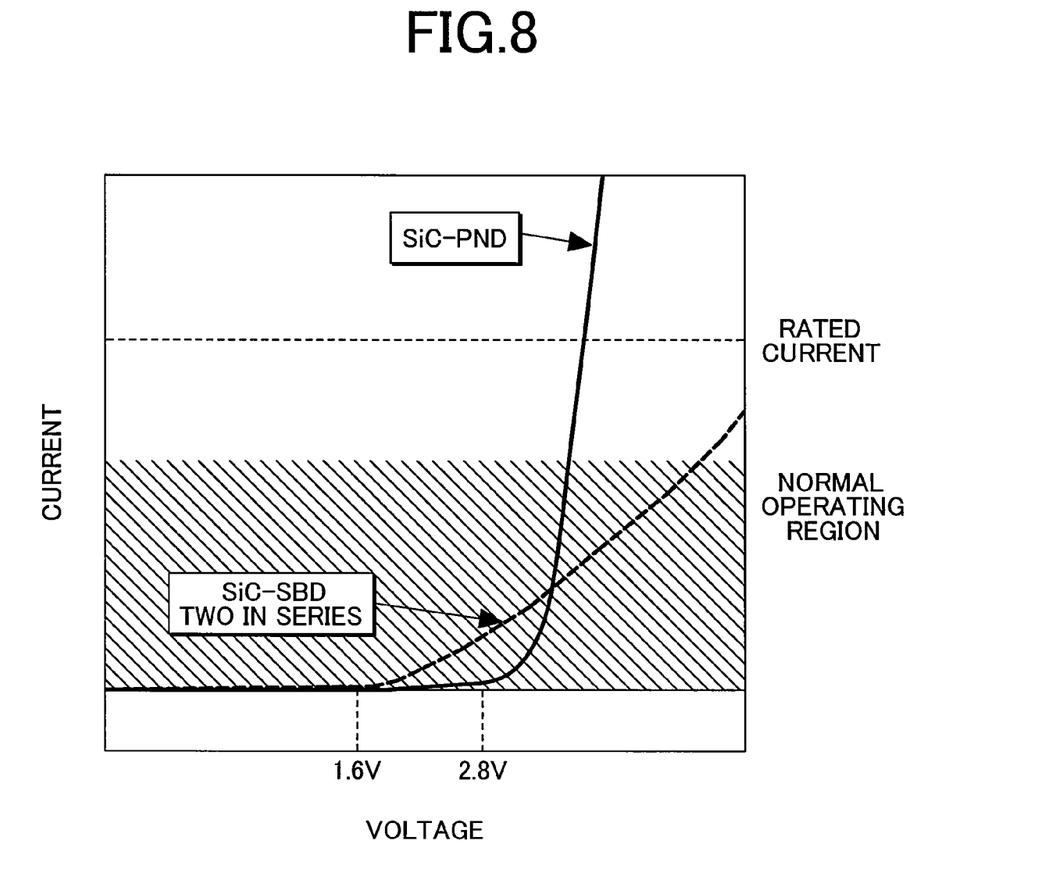
FIG. 8 shows the current-voltage characteristics of the module according to the second embodiment of the present invention.

FIG. 7 illustrates the second embodiment and shows a part of a circuit diagram depicting a power module that is used as an inverter circuit. The example shown in FIG. 7 differs from the one shown in FIG. 1 in that a PiN diode made of a semiconductor material having a wider band gap than silicon is used in place of a PiN diode made of a silicon semiconductor and that a series-connected Schottky barrier diode is used. A typical example of the semiconductor material having a wider band gap than the silicon is silicon carbide (SiC). Gallium nitride (GaN) can also be used as the above semiconductor material. FIG. 8 shows the current-voltage characteristics of the example shown in FIG. 7. A solid-line curve indicates the characteristics of the SiC-PND. A broken-line curve indicates the characteristics of two series-connected SiC-SBDs. In general, the SiC-PND and SiC-SBD considerably differ in static characteristics and do not simultaneously operate within a normal operating region in most cases. However, when two series-connected SiC-SBDs are used to raise the voltage at which the current rises, the two types of diodes simultaneously operate in a certain region. Consequently, the mixed use of the SiC-SBD makes it possible to reduce the total amount of recovery current and minimize the loss while suppressing noise with the recovery current of the SiC-PND as is the case with the first embodiment.

In the above embodiments, a switching device other than a Si-IGBT may be used. For example, a Si-GTO (Gate Turn On Thyristor), SiC-MOSFET (Metal-Oxide Semiconductor Field-Effect Transistor), or SiC-JFET (Junction Field Effect Transistor) may be used as the switching device.

The present invention is a circuit arrangement or circuit module including at least one switching device and a diode that conducts when the switching device turns off and is reversely biased when the switching device turns on. The present invention is extremely useful when it is applied to an inverter for direct current-to-alternating current conversion, rectifier, direct current transducer, or other converter.

What is claimed is:

1. A circuit arrangement comprising:
   at least one switching device; and
   a free-wheel diode connected in parallel with the switching device;
   wherein the free-wheel diode is formed by connecting a silicon PiN diode in parallel with a Schottky barrier diode that uses a semiconductor material having a wider band gap than silicon as a base material; and
   wherein the silicon PiN diode and Schottky barrier diode are separate chips.

2. A circuit arrangement comprising:
   at least one switching device; and
   a free-wheel diode connected in parallel with the switching device;
   wherein the free-wheel diode is formed by connecting a PiN diode in series with two or more Schottky barrier diodes;
   wherein the Schottky barrier diodes use a semiconductor material having a wider band gap than silicon as a base material;
   wherein the PiN diode uses a semiconductor material having a wider band gap than silicon as a base material; and
   the Schottky barrier diodes and the PiN diode are separate chips.

3. The circuit arrangement according to claim 1, wherein the semiconductor material having a wider band gap than silicon is silicon carbide (SiC) or gallium nitride (GaN).

4. The circuit arrangement according to claim 2, wherein the semiconductor material that constitutes the Schottky barrier diodes and the PiN diode and that has a wider band gap than silicon is silicon carbide (SiC) or gallium nitride (GaN).

5. The circuit arrangement according to claim 1, wherein the Schottky barrier diode includes a plurality of parallel-connected Schottky barrier diode chips; and wherein the PiN diode includes a smaller number of chips than the Schottky barrier diode.

6. The circuit arrangement according to claim 1, wherein the PiN diode has a smaller junction area than the Schottky barrier diode.

7. The circuit arrangement according to claim 1, wherein the Schottky barrier diode is a junction barrier Schottky diode.

8. The circuit arrangement according to claim 2, wherein the Schottky barrier diodes are junction barrier Schottky diodes.

\* \* \* \* \*